United States Patent [19]
Shoji

[11] Patent Number: 5,869,904
[45] Date of Patent: Feb. 9, 1999

[54] SEMICONDUCTOR DEVICE HAVING A PROJECTING ELECTRODE

[75] Inventor: Kazutaka Shoji, Tokyo, Japan

[73] Assignee: NEC Corporation, Tokyo, Japan

[21] Appl. No.: 66,761

[22] Filed: Apr. 28, 1998

[30] Foreign Application Priority Data

Apr. 28, 1997 [JP] Japan ................................ 9-110840

[51] Int. Cl.⁶ ........................... H01L 23/48; H01L 23/52; H01L 29/40
[52] U.S. Cl. ........................... 257/779; 257/780; 257/778; 257/782; 257/787
[58] Field of Search ........................... 257/778, 779, 257/780, 783, 787, 782

[56] References Cited

U.S. PATENT DOCUMENTS

| | | | |
|---|---|---|---|
| 5,641,996 | 6/1997 | Omoya et al. | 257/780 |
| 5,764,485 | 6/1998 | Lebaschi | 257/779 |
| 5,773,888 | 6/1998 | Hosomi et al. | 257/779 |

FOREIGN PATENT DOCUMENTS

| | | |
|---|---|---|
| 8-181423 | 7/1996 | Japan . |
| 8-236654 | 9/1996 | Japan . |

*Primary Examiner*—Mahshid D. Saadat
*Assistant Examiner*—S. V. Clark
*Attorney, Agent, or Firm*—Sughrue, Mion, Zinn, Macpeak & Seas, PLLC

[57] ABSTRACT

A semiconductor device comprises a plurality of solder bumps each formed on a pad of a semiconductor device. The top of each of the solder bumps is covered with a masking film, and the bases of the solder bumps are buried with a reinforcement film. The oxidation of the solder bumps is prevented by the masking film and the reinforcement film, the latter also undertaking the thermal stress generated between the semiconductor chip and the circuit board. The mounting is conducted with the masking film remaining on the top of the solder ball, which breaks the masking film and connected to the pad on the circuit board.

7 Claims, 6 Drawing Sheets

SEMICONDUCTOR DEVICE HAVING A PROJECTING ELECTRODE

BACKGROUND OF THE INVENTION

1. (a) Field of the Invention

The present invention relates to a semiconductor device having a projecting electrode and, more particularly, to a technique for fabricating projecting electrodes on a semiconductor device.

2. (b) Description of the Related Art

Examples of mounting techniques for a semiconductor device using projecting electrodes include a flip-chip bonding and a ball grid array (BGA) bonding. To mount a semiconductor chip on a printed circuit board by using a flip-chip bonding technique, for example, an array of ball electrodes made of gold or solder are first formed on the electrodes of the semiconductor chip, then thermally melted by using a thermal-pressing technique or reflow technique after the ball electrodes are disposed on the lands of the mounting board, followed by hardening by cooling.

Figure 1:
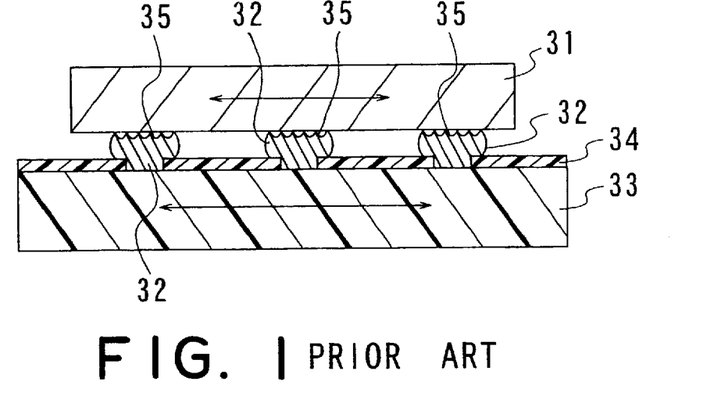
FIG. 1 is a cross-sectional view of a conventional semiconductor chip mounted on a mounting board by a flip-chip bonding technique.

FIG. 1 shows a flip-chip bonding technique, wherein a semiconductor chip 31 is mounted on a printed circuit board 33 by using a plurality of ball electrodes 32. The ball electrodes 32 are bonded to respective solder lands of interconnects in the printed circuit board 33.

Ball electrodes are also used for mounting onto a mounting board a so-called BGA semiconductor device fabricated by mounting a semiconductor chip on a printed circuit board, ceramic circuit board or polyimide film having an interconnect pattern, followed by sealing the semiconductor chip with a sealing resin. The BGA semiconductor device generally comprises a plurality of ball electrodes, called solder bumps, made of solder balls and arranged in a two-dimensional matrix on the bottom surface of the semiconductor chip. In this text, a semiconductor chip having ball electrodes used for a flip-chip mounting technique, as mentioned above, is also called a BGA semiconductor device or chip.

A BGA semiconductor device 31 mounted on a circuit board 33 using ball electrodes 32 sometimes suffers from cracks 35 such as shown in FIG. 1 in the bases of the ball electrodes 32 after a long time operation. The cracks 35 are considered to be caused by a large difference in the thermal expansion coefficient between the BGA semiconductor chip 31 and the mounting board 33 mounting the same.

Specifically, a semiconductor chip 31 formed on a silicon substrate has a thermal expansion coefficient considerably lower than that of the mounting board 33 made of a resin. The heat generated in the semiconductor chip 31 during operation thereof and by other electric components generates a difference in the thermal expansion (shown by the lengths of arrows in FIG. 1) between the semiconductor chip 31 and the mounting board 33. The difference in the thermal expansion causes a shear force in the ball electrodes 32 to generate cracks 35 therein.

Figure 2:
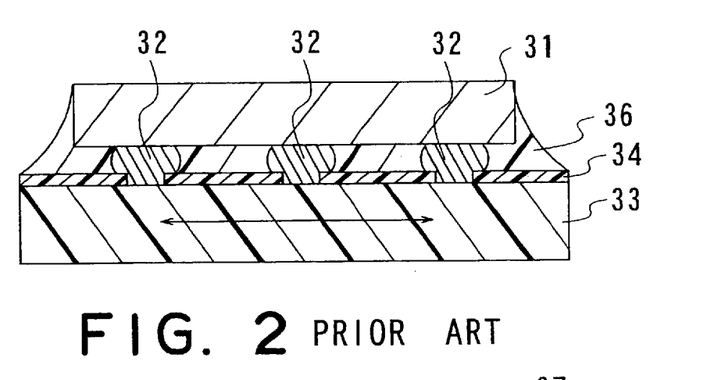
FIG. 2 is a cross-sectional view of another conventional semiconductor chip mounted on a mounting board.
Figure 3:
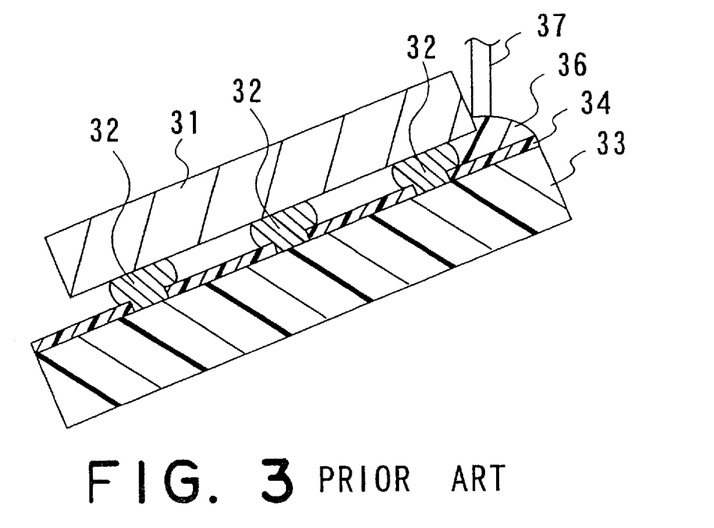
FIG. 3 is a cross-sectional view of the semiconductor chip and the mounting board of FIG. 2 in a step for sealing the space therebetween.

The problem cracks can be solved to some extent by filling the space between the semiconductor chip 31 and the mounting board 33 with a resin as shown in FIG. 2. Patent Publication JP-A-4-219944 describes the structure of FIG. 2, wherein a thermosetting resin 36 is used for the filling. To obtain the structure of FIG. 2, it is proposed in the publication that the semiconductor chip 31 mounted on the circuit board 33 be slanted and the space therebetween be filled with a thermosetting resin 36 having a low viscosity by using a nozzle 37 and a capillary function of the space, as shown in FIG. 3. However, this process has a disadvantage in that a semiconductor chip 31 or board 33 having a defect therein found after the filling cannot be replaced by another equivalent semiconductor chip or board.

Patent Publication JP-A-8-236654 proposes that the bases of the solder bumps be coated with a resin to improve the reliability irrespective of the thermally sever condition such as a thermal impact test after the mounting. The proposed structure may be obtained by the steps of coating the entire surface of the solder bumps formed on a semiconductor chip with a resin and subsequent removing the resin at the tops of the solder bumps, or by the steps of masking the tops of the solder bumps with a resin film, filling the space between the bases of the solder bumps with a resin, curing the filled resin and removing the masking film from the tops of the solder bumps. This technique, however, also involves other problems in that the removal of the masking film effected as by surface treatment raises the costs of the resultant semiconductor device, and in that the solder bumps are often peeled off due to the moisture absorbed after the removal of the masking film and a rapid heating during the mounting.

If only the space between the bases of the solder bumps are filled with resin and the resin is cured, which is also possible, the tops of the solder bumps are often oxidized due to the high temperature ambient, which causes defects after the mounting. The problem oxidation of the solder bumps may be also involved in the process using the removal of the masking film from the tops of the solder bumps, as mentioned above, or during the storage of the semiconductor device having the solder bumps. In any case, the solder bumps generally suffer from the oxidation in the thermal process and should be carefully treated as such.

SUMMARY OF THE INVENTION

In view of the above, it is an object of the present invention to solve the above problem and to provide a semiconductor device capable of preventing oxidation of the ball electrodes and cracks during the mounting.

It is an additional object of the present invention to provide a semiconductor device capable of removing the semiconductor chip from the mounting board after the mounting, if desired.

It is a further object of the present invention to provide a method for manufacturing such a semiconductor device.

The present invention provides a semiconductor device comprising a semiconductor chip, an insulating base film underlying a surface of the semiconductor chip, a plurality of projecting electrodes formed on the base film and connected to respective interconnects in the semiconductor chip, a masking film formed on a top of each of the projecting electrodes, and a reinforcement film embedding bases of the plurality of projecting electrodes.

The present invention also provides a method for mounting a semiconductor device onto a circuit board comprising the steps of forming a plurality of projecting electrodes on an insulating base film overlying a semiconductor chip, forming a masking film on a top of each of the projecting electrodes, mounting the semiconductor chip onto the circuit board so that the masking film is in contact with a corresponding pad formed on the circuit board, thermally connecting each of the projecting electrodes with a corresponding pad while breaking and melting the masking film.

According to the semiconductor device of the present invention, the reinforcement film undertakes the shear force caused by heat generated by operation of the semiconductor device whereas the masking film prevents oxidation of the projecting electrodes in association with the reinforcement film. Accordingly, a mechanically and electrically reliable semiconductor device can be obtained.

The above and other objects, features and advantages of the present invention will be more apparent from the following description, referring to the accompanying drawings.

DESCRIPTION OF THE PREFERRED EMBODIMENTS

Now, the present invention is more specifically described with reference to accompanying drawings, wherein similar constituent elements are designated by the same or similar reference numerals.

Figure 4:
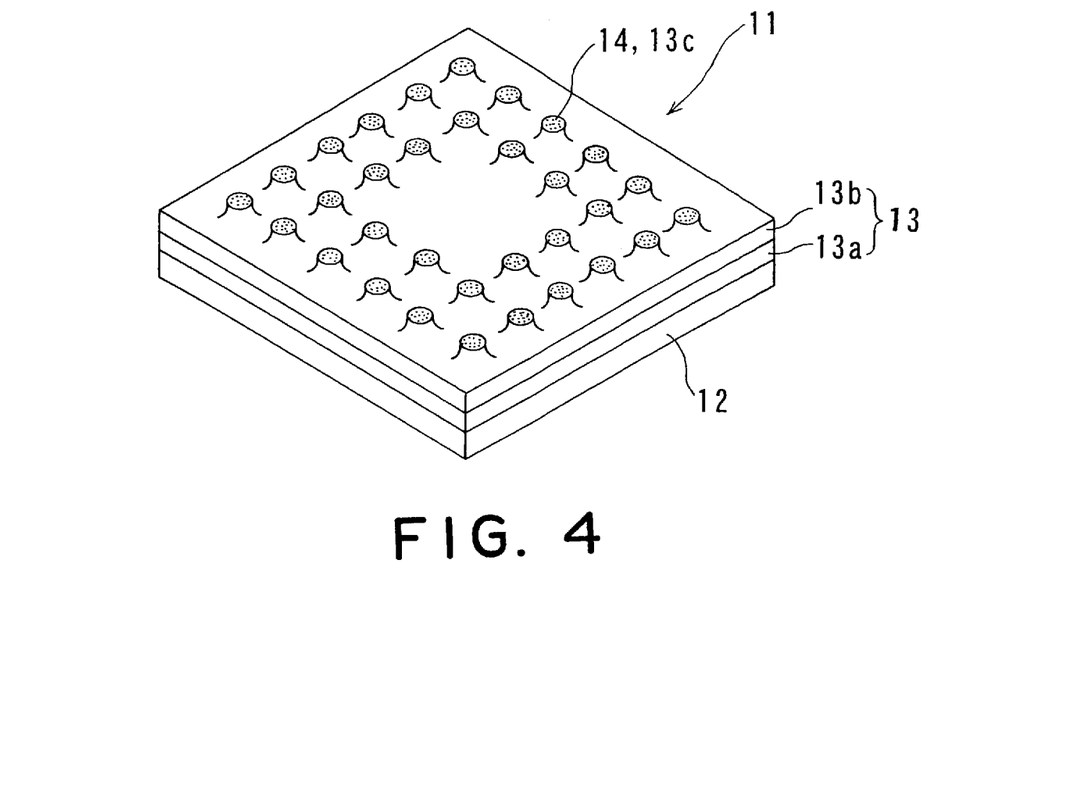
FIG. 4 is a perspective view of a semiconductor device having an array of projecting electrodes according to an embodiment of the present invention.

Referring to FIG. 4, a semiconductor device 11 according to an embodiment of the present invention comprises a semiconductor chip 12, and an interposer (or interposition) 13 formed on the bottom surface of the semiconductor chip 12. The interposer 13 includes a polyimide base film 13a formed on the bottom surface of the semiconductor chip 12 and a solder resist film 13b formed on the base film 13a. The solder resist film 13b is made of a polyimide based synthetic resin. The semiconductor device 11 further comprises a plurality of projecting electrodes each including a pad 13c and an overlying ball electrodes or solder bumps 14. The projecting electrodes are arranged in a two-dimensional matrix on the solder resist film 13b except for the central part of the semiconductor device 11.

Figure 5:
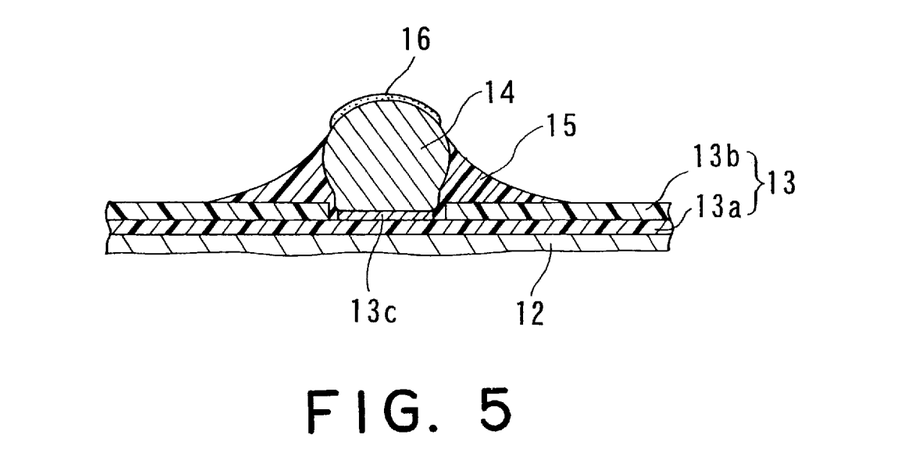
FIG. 5 is a cross-sectional view of the solder bump of FIG. 4

Referring to FIG. 5 showing a partial cross-section of the semiconductor device 11 of FIG. 4, each ball electrode 14 is implemented by a solder bump, and has an axisymmetric configuration and substantially a spherical surface except for the bottom portion thereof. The solder bump 14 is bonded to an underlying pad 13c formed on a portion of the base film 13a which is exposed through an opening formed in the solder resist film 13b. The pad 13c is connected to an interconnect of a conductive pattern formed within the base film 13a, the interconnect being connected via a through-hole (not shown) formed in the base film 13a to an electrode formed on the semiconductor chip 12.

The solder bump 14 is formed by positioning a solder ball on the pad 13c, then melting and solidifying the solder ball. The solder bump 14 has a top and a base in FIG. 5. The base occupies approximately bottom half or more of the solder bump 14 and is embedded by a reinforcement film 15 made of polyimide based synthetic resin, which extends on the interposer 13. The reinforcement film 15 has a maximum thickness at the periphery of the solder bump 14 and reduces in thickness along the radially outward direction from the solder bump 14. At the central point of a line extending between two solder bumps 14 opposed diagonally, the reinforcement film 15 has a thickness around zero in this embodiment.

The top of the solder bump 14 is covered by a masking film 16 made of synthetic resin such as fluorine based polymer or organic material having little affinity with the reinforcement film 15. The term "affinity" used herein means a property between two materials, which enables mixing or fusing together. If two materials have a large affinity, one of the materials spreads as a liquid and stays on the surface of a film made of the other, whereas if two materials have little affinity, one of the materials is expelled from the surface of a film made of the other. In this embodiment, if the masking film 16 is made of fluorine based synthetic resin, the reinforcement film 15 is preferably made of polyimide, for example.

In the present embodiment, the masking film 16 formed on the top of the solder bump 14 before forming the reinforcement film 15 is left on the top of the solder bump 14 during mounting the semiconductor device 11 on a mounting board, although a masking film 16 is generally removed or rinsed away before mounting in a conventional process. In the present embodiment, the material for the masking film 16 is selected from this view point. Specifically, the material for the masking film 16 has a property of poor adherence with the solder bump 14. In addition, the masking film 16 has an extremely small thickness, which enables easy breaking of the film 16 due to the deformation of the solder ball 14 during the melting of the solder ball. The easy breaking and poor adherence to the solder bump 14 enables the electric connection of the solder bump 14 with a pad of the circuit board.

The masking film 16 also functions for prevention of oxidation of the surface of the solder bump 14 during formation and hardening of the reinforcement film 15 and during storage of the semiconductor device before the mounting. The solder bump 14 is substantially entirely covered by the top masking film 16 and the base reinforcement film 15 after the formation of the reinforcement film 15.

Figure 6A:
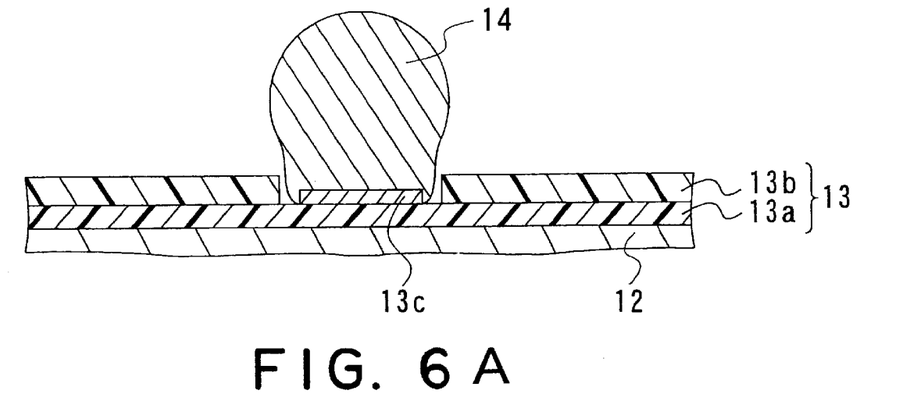
FIGS. 6A to 6C are cross-sectional views of the solder bump of FIG. 5 in consecutive steps for fabrication thereof.
Figure 6B:
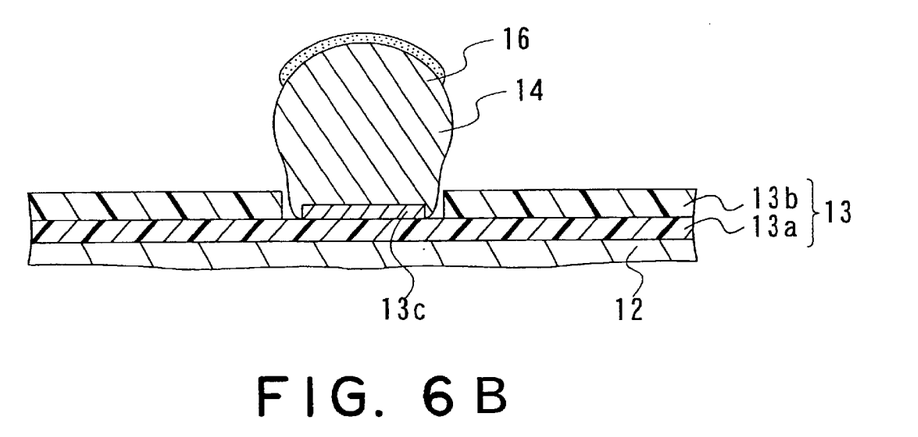
Figure 6C:
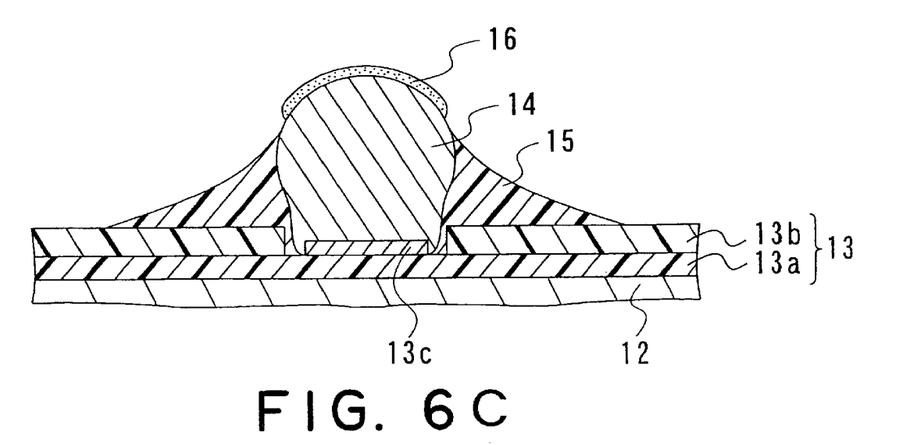

Referring to FIGS. 6A to 6C, there is shown a process for forming the solder bump 14 and the reinforcement film 15 and the masking film 16 of FIG. 5. The solder bump 14 is first formed on the pad 13c formed on the base film 13a, as shown in FIG. 6A. The masking film 16 is then formed on the top of the solder bump 14 by application and transcription steps, as shown in FIG. 6B. Specifically, a solution or liquid made by dissolving a fluorine based resin in a solvent is applied onto the surface of a rubber roller to have a constant thickness. The rubber roller is then pressed against the tops of the array of solder bumps 14 while rolling the same for transcription of the solution onto the tops of the solder bumps 14. After the solvent is evaporated, the fluorine based resin is fixed onto the tops of the solder bumps 14 to form the masking films 16.

Subsequently, a resin for the reinforcement film 15 is applied onto the interposer 13 to embed the bases of the solder balls 14, with the bottom surface of the semiconductor device 11 directed upward. In this embodiment, a liquid made by dissolving a polyimide resin in an NMP (N-methylpyrolidone) solution is applied onto the interposer 13 by a spray-coating technique. The top masking film 16, having little affinity with the resin for the reinforcement film 15, expels the applied resin from the surface of the top masking film 16. That is, the reinforcement film 15 is formed only on the interposer 13 and the exposed surface of the projecting electrode 13c and 14. The amount of the applied resin for the reinforcement film 15 is controlled so that the exposed surfaces of the solder balls 14 is entirely covered by the resin. After the application, the resin is thermally cured in a thermal reactor to form the reinforcement film 15.

The polyimide resin for the reinforcement film 15 is selected from thermosetting resins. If the thermosetting resin has a curing temperature lower than the melting point of the solder bump 14, the solder bump 14 maintains the original shape thereof, whereas if the thermosetting resin has a curing temperature higher than the melting point of the solder bump 14, the solder bump 14 melts during the curing of the reinforcement film 15 and assumes substantially a sphere after the curing thereof due to the presence of the top masking film 16 and to the surface tension of the solder.

The resin for the reinforcement film 15 is mostly collected around the solder balls 14 due to its surface tension and reduces its volume after the hardening thereof due to the evaporation of the solvent. As a result, the reinforcement film 15 has a largest thickness around the solder bumps 14, reduces its thickness along the radially outward direction from the solder bumps 14, and has a axisymetric geometry with respect to the axis of each solder bump 14 passing through the center of the solder bump 14 normal to the surface of the interposer 13, as shown in FIG. 6C.

Figure 7:
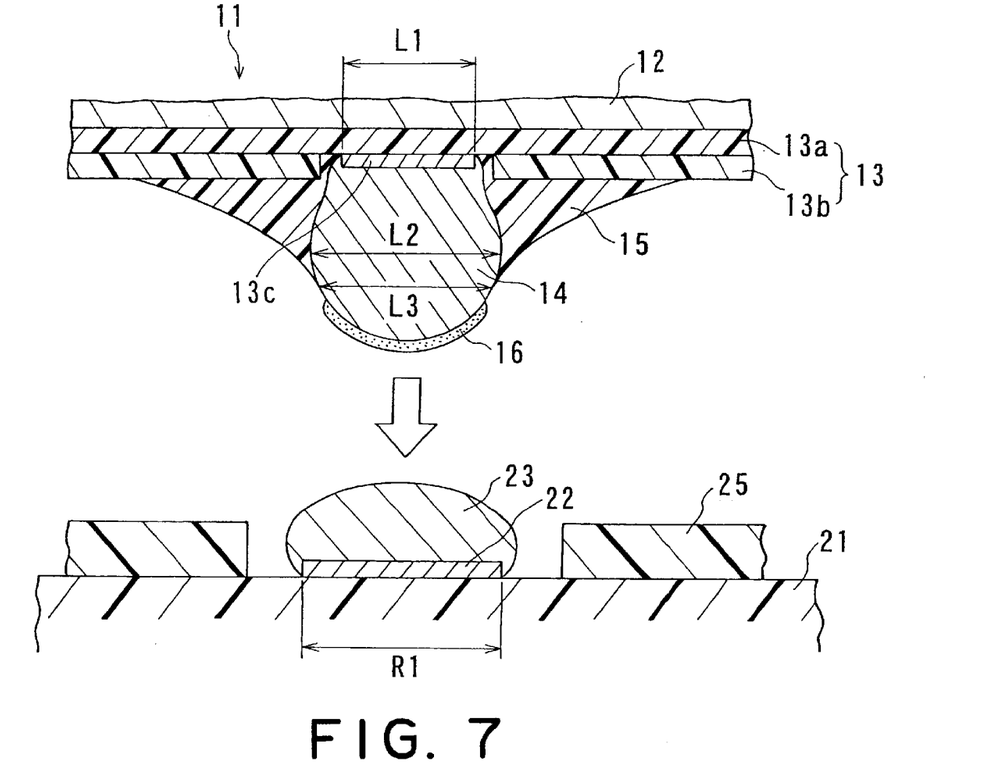
FIG. 7 is a cross-sectional view of the solder bump of FIG. 4 during a mounting step of the semiconductor device.
Figure 8:
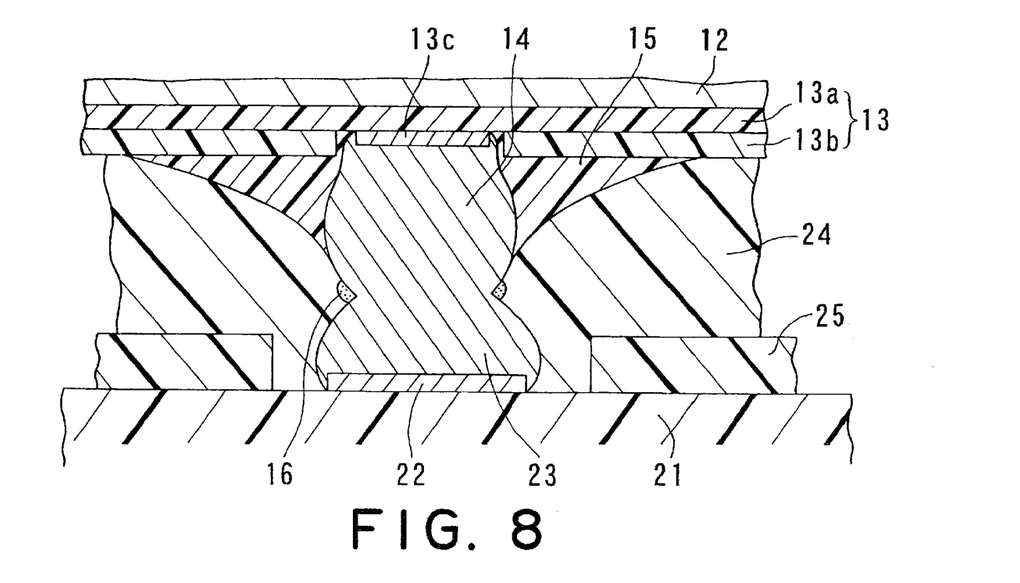
FIG. 8 is a cross-sectional view of the solder bump of FIG. 7 after the mounting.

FIG. 7 shows the solder bump of FIG. 5 during mounting the semiconductor device of FIG. 4 onto a circuit board or mounting board 21. The mounting board 21 has thereon a plurality of pads 22, on each of which an auxiliary or spare solder 23 is formed, and which is exposed through respective openings formed in a solder resist film 25. The semiconductor device 11 and the circuit board 21 are placed in a thermal reactor or reflow reactor so that each solder bump 14 abuts with a corresponding auxiliary solder 23. FIG. 8 shows the semiconductor device at a step after melting and hardening of the solder bumps 14 and the auxiliary solders 23. The semiconductor device is mounted on the mounting board 21, with the solder bump 14 and the auxiliary solder 23 melted together. The connected solder bumps 14 are sealed with a thermosetting sealing resin 24 filled between the interposer 13 and the mounting board 21 after the mounting, in the present embodiment.

Figure 9:
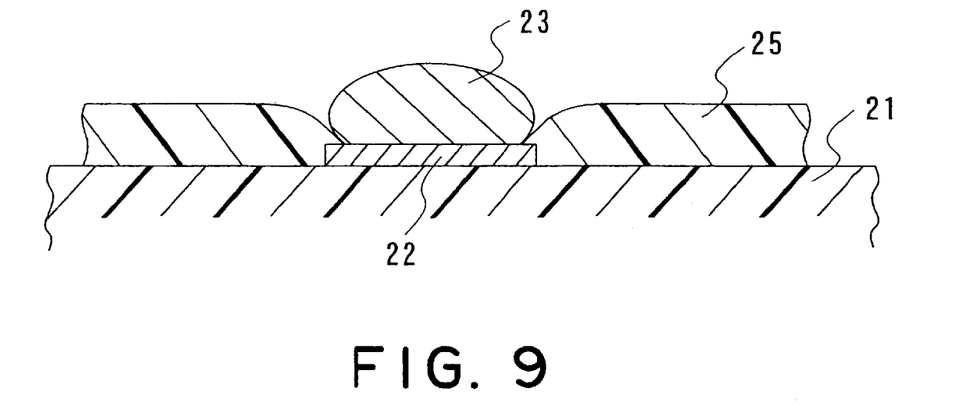
FIG. 9 is a cross-sectional view of another example of a mounting board.

In the above mounting process, the top masking film 16 is broken and melted down during the reflow step for the solder due to the small thickness, for example, below 1 $\mu$m of the masking film 16 and a small adherence to the solder. The solder resist film 25 on the mounting board 21 in FIGS. 7 and 8 is illustrated to have a space between the same and the pad 22. In an alternative, as shown in FIG. 9, the edge of the opening of the solder resist film 25 may overlap with the pad 22. In this case, the periphery of the auxiliary solder 23 is in contact with the surface of the solder resist film 25. The pad 22 generally has a disk shape.

The reinforcement film 15 undertakes a shear force exerted to the bases of the solder bumps 14 due to the heat generated during operation of the semiconductor device, thereby preventing dislocation of the solder bumps 14 and cracks in the solder bumps 14. If the seal resin 24 is not provided between the semiconductor device and the mounting board in FIG. 8, both the components can be easily separated after the mounting. Accordingly, if an electric or mechanical element is found to have a defect in a component, i.e., either the semiconductor device or the circuit board, the component having the defective element can be replaced by a new component.

The geometry of the reinforcement film 15 having a smaller thickness along the radially outward direction from the solder bump 14 enables dispersion of the mechanical stress generated in the solder bump 14. The little affinity between the top masking film 16 and the base reinforcement film 15 enables separation of the reinforcement film 15 from the top masking film 16. A transcription process for the resin of the top masking film 16, if used, enables formation of a uniform thickness of the masking film 16 among the solder bumps 14, which in turn functions for assisting formation of uniform thickness of the reinforcement film 15 around the solder bumps 14.

The solder bump 14 as used in this embodiment may be replaced by a gold bump. Also, the present invention may be applied to a process for mounting a BGA semiconductor device onto a mounting board, as well as the process for mounting a semiconductor chip onto a printed circuit board as described above.

The materials for the interposer 13, reinforcement film 15 and the masking film 16 may be selected as desired. Examples of these materials are recited below.

Materials for the reinforcement film

The materials for the reinforcement film 15 are preferably selected from a material group having an excellent adherence to the materials for the solder bump 14 and the interposer 13 on which the solder bumps 14 are formed. Table 1 shows exemplified combinations of the materials for the interposer 13 (or material on which solder bumps are formed) and the reinforcement film 15.

TABLE 1

| Interposer | Reinforcement film | Adherence |
|---|---|---|
| Polyimide based resin (embodiment) | Polyimide based resin | Large |
|  | Epoxy based resin | Medium |
|  | Phenol based resin | Medium |
| Glass epoxy substrate | Epoxy based resin | Large |
|  | Phenol based resin | Large |
|  | Acrylic based resin | Medium |
|  | Polyimide based resin | Small |
| Ceramic substrate | Phenol based resin | Large |
|  | Epoxy based resin | Large or medium |
|  | Acrylic based resin | Medium |
|  | Polyimide resin | Medium |
| Silicon chip (flip-chip) | Polyimide based resin | Large |
|  | Epoxy based resin | Large |
|  | Phenol based resin | Large |

Epoxy based resin is most preferable as a material for the reinforcement film 15 because of a low cost of thereof.

Material for the masking film

Materials for the masking film 16 may be any material so long as it has little affinity with the reinforcement film 15. Exemplified combinations of the reinforcement film 15 and the masking film 16 are tabulated in Table 2 together with the affinity therebetween.

TABLE 2

| Reinforcement film | Masking film | Affinity |
|---|---|---|
| Polyimide based resin (embodiment) | Fluorine based resin | Little |
| | Fluorine based oil | Little |
| | Paraffin based resin | Much |
| | Paraffin based oil | Much |
| Epoxy based resin (solvent: Ketone, alcohol) | Fluorine based resin | Little |
| | Fluorine based oil | Little |
| | Paraffin based resin | Much |
| | Paraffin based oil | Much |
| Phenol based resin (solvent: ketone, alchohol) | Fluorine based resin | Little |
| | Fluorine based oil | Little |
| | Paraffin based resin | Much |
| | Silicone based resin | Medium |
| | Silicone based oil | Medium |
| Acrylic based resin (water-soluble) | Fluorine based resin | Little |
| | Fluorine based oil | Little |
| | Paraffin based resin | Little |
| | Paraffin based oil | Little |
| | Silicone based resin | Medium |
| | Silicone based oil | Medium |

Paraffin based resin or paraffin based oil are more preferable for the masking film 16 because of the low cost thereof, although fluorine based resin is preferable from technical view point.

Process for formation of the masking film

In order to form a masking film 16 on the top of the solder bump 14, a printing technique using a mask may be used instead. Specifically, a mask film having an opening on the top of the solder bump 14 is first formed on a semiconductor chip 12 or a BGA semiconductor device, followed by applying the material for the masking film 16 through the mask by using a squeegee technique.

The mask film 16 may be formed also by dipping the tops of the solder bumps 14 in a liquid for the masking film 16. In this process, after receiving the liquid in a dish at a specified depth, the top of the solder bumps 14 are lowered therein until the tops of the solder bumps 14 become in contact with the bottom of the dish.

Process for formation of the reinforcement film

The process for forming the reinforcement film 15 may be any process so long as the thickness of the reinforcement film 15 is controlled as desired on the interposer 13. In addition to the spray-coating as mentioned above, spin-coating, potting, mask printing or dipping process may be used. The spin-coating process is effected, for example, by dropping liquid droplets onto the interposer 13 while rotating the interposer 13 together with the semiconductor chip 12 at a high speed. The potting process is effected, for example, by dropping a liquid for the reinforcement film on the entire surface of the interposer 13. The mask printing process is effected, for example, by positioning a mask having openings on the tops of the solder bumps 14 and in the vicinities thereof and applying a liquid for the reinforcement film through the mask by a technique. The dipping process is effected, for example, by dipping the interposer 13 and the semiconductor chip 12 in a liquid for the reinforcement film 15.

Figure 10:
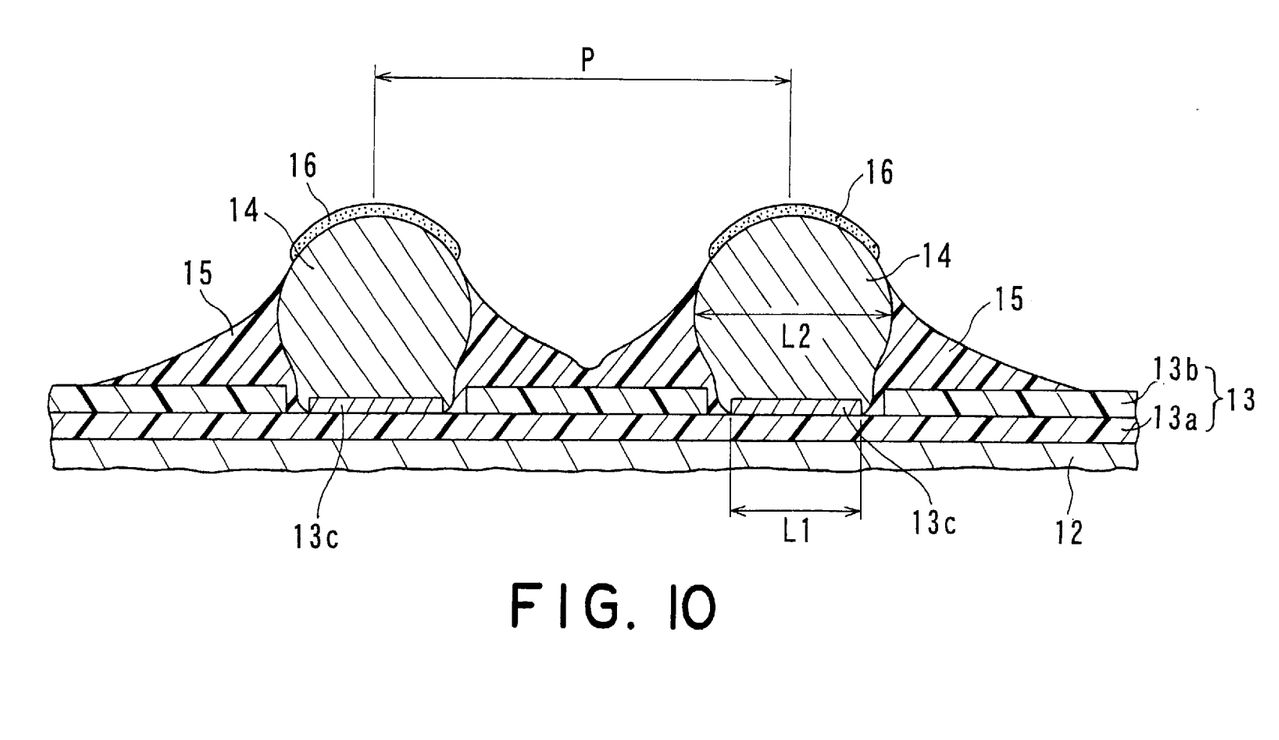
FIG. 10 is a cross-sectional view of solder bumps for showing the dimensions thereof.

In a preferred embodiment of the present invention, the maximum diameter (L2) of the solder bump 14, as shown in FIG. 10, is preferably selected at 1.2 times the diameter (L1) of the pad 13c formed on the base film 13a or greater. For example, if the diameter (L1) of the pad 13c is 180 $\mu$m, the maximum diameter (L2) of the solder bump 14 is preferably between 220 $\mu$m and 300 $\mu$m.

The maximum diameter (L2) of solder bump 14 has no lower limit in the present invention. However, in a practical view point, or in view that the solder of the solder bump 14 spreads on the pad 13c, the maximum diameter (L2) of the solder bump 14 should be not smaller than the diameter (L1) of the pad 13c. A smaller diameter (L1) of the pad 13c does not cause a mechanical damage during or after the mounting due to the function of the reinforcement film 15. In addition, a larger diameter (L2) for the solder bump 14 provides a reliable connection during the mounting.

In FIG. 10, the maximum diameter (L2) of the solder bump 14 does not exceed the pitch (P) of the solder bump 14, the pitch (P) being around 500 $\mu$m, for example. In a practical view point, the maximum diameter (L2) of the solder bump 14 is preferable between 0.6 P and 0.7 P. If L2>0.8 P, a bridge failure may occur between the solder bumps 14.

In FIG. 4, the maximum diameter (L2) of the solder bump 14 may be preferably equivalent to the diameter (R1) of the pad 22 on the circuit board 21, that is, L2 is preferably between 0.8 R1 and 1.2 R1. In a conventional BGA semiconductor device mounted on a mounting board, the pad 13c on the semiconductor device 11 generally has a diameter equivalent to that of the pad 22 on the mounting board 21. In the present invention, as shown in FIG. 7, the diameter (L3) of the opening from which the solder bump 14 protrudes from the reinforcement film 15 is preferably selected equivalent to the diameter R1 of the pad 22 on the mounting board 21. In the present embodiment, the diameter L3 is approximately equal to the maximum diameter L2.

EXAMPLES

Samples of the semiconductor device according to the present embodiment shown in FIG. 4 and comparative examples having similar configuration except for the absence of the reinforcement film 15 were subjected to reliability tests using heat cycle tests. In the heat cycles, the samples and the comparative examples were maintained iteratively at −40° C. and 125° C. Each of the samples and comparative examples had a package dimensions of 10 mm×10 mm, the solder bump maximum diameter of 200 $\mu$m to 250 $\mu$m and reinforcement film thickness of 100 $\mu$m to 150 $\mu$m. The samples endured for 1000 cycles for the heat cycle tests whereas the comparative examples endured only for 250 heat cycles, demonstrating the advantage of the present invention.

Since the above embodiments are described only for examples, the present invention is not limited to the above embodiments and various modifications or alterations can be easily made therefrom by those skilled in the art without departing from the scope of the present invention.

What is claimed is:

1. A semiconductor device comprising a semiconductor chip, an insulating base film underlying a surface of said semiconductor chip, a plurality of projecting electrodes formed on said base film and connected to respective interconnects in said semiconductor chip, a masking film formed on a top of each of said projecting electrodes, and a reinforcement film embedding bases of said plurality of projecting electrodes.

2. A semiconductor device as defined in claim 1, wherein a material for said masking film has little affinity with a material for said reinforcement film.

3. A semiconductor device as defined in claim 1, wherein said reinforcement film has a maximum thickness at peripheries of said projecting electrodes and reduces in thickness along a radially outward direction from each projecting electrode.

4. A semiconductor device as defined in claim 1, wherein each of said projecting electrodes comprises a pad and a ball electrode formed on said pad.

5. A semiconductor device as defined in claim 4, wherein said ball electrode is made of solder or gold.

6. A semiconductor device as defined in claim 4, wherein said ball electrode has a maximum diameter (L2) not smaller than 1.2 times a diameter (L1) of said pad and not larger than 0.8 times a pitch (P) of said projecting electrodes.

7. A semiconductor device as defined in claim 4, wherein said base of the projecting electrodes occupies approximately a bottom half of said ball electrode.

* * * * *